US008644125B2

(12) United States Patent
Chou et al.

(10) Patent No.: US 8,644,125 B2
(45) Date of Patent: Feb. 4, 2014

(54) SEEK SCAN PROBE (SSP) CANTILEVER TO MOVER WAFER BOND STOP

(75) Inventors: Tsung-Kuan Allen Chou, San Jose, CA (US); Nickolai Belov, Los Gatos, CA (US); John Heck, Berkeley, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/242,843

(22) Filed: Sep. 30, 2008

(65) Prior Publication Data

US 2013/0058202 A1 Mar. 7, 2013

(51) Int. Cl.
  *H01L 23/02* (2006.01)
  *H01L 23/31* (2006.01)
  *H01L 21/98* (2006.01)

(52) U.S. Cl.
  USPC .... 369/126; 257/682; 257/730; 257/E23.127; 257/E23.197; 257/E27.705; 438/107

(58) Field of Classification Search
  USPC .............. 257/682, 730, E23.125, E23.127, 257/E23.197, E21.705; 438/107; 369/126
  See application file for complete search history.

(56) References Cited

U.S. PATENT DOCUMENTS

| | | | | |
|---|---|---|---|---|
| 7,172,911 | B2 * | 2/2007 | Kalvesten et al. | 438/29 |
| 7,354,788 | B2 * | 4/2008 | Bar-Sadeh et al. | 438/52 |
| 7,796,492 | B2 * | 9/2010 | Chou et al. | 369/126 |
| 7,796,493 | B2 * | 9/2010 | Chou et al. | 369/126 |
| 7,869,334 | B2 * | 1/2011 | Heck | 369/126 |
| 8,000,216 | B2 * | 8/2011 | Chou et al. | 369/126 |
| 8,018,821 | B2 * | 9/2011 | Heck | 369/126 |
| 8,149,680 | B2 * | 4/2012 | Rao et al. | 369/126 |
| 8,233,373 | B2 * | 7/2012 | Chou et al. | 369/126 |
| 2011/0078835 | A1 * | 3/2011 | Heck | 850/59 |

* cited by examiner

*Primary Examiner* — Evan Pert
(74) *Attorney, Agent, or Firm* — Blakely, Sokoloff, Taylor & Zafman LLP

(57) ABSTRACT

A seek-scan probe (SSP) memory involves multiple-wafer bonding needing precision small gaps in between. Solder reflow bonding is typically used to join the wafers due to its reliability and ability to hermetically seal. However, solder reflow bonding may not provide a consistently controllable gap due to flowing solder during the bonding process. Thus, a bond stop technique and process is used to provide accurate cantilever to media gap control.

18 Claims, 15 Drawing Sheets

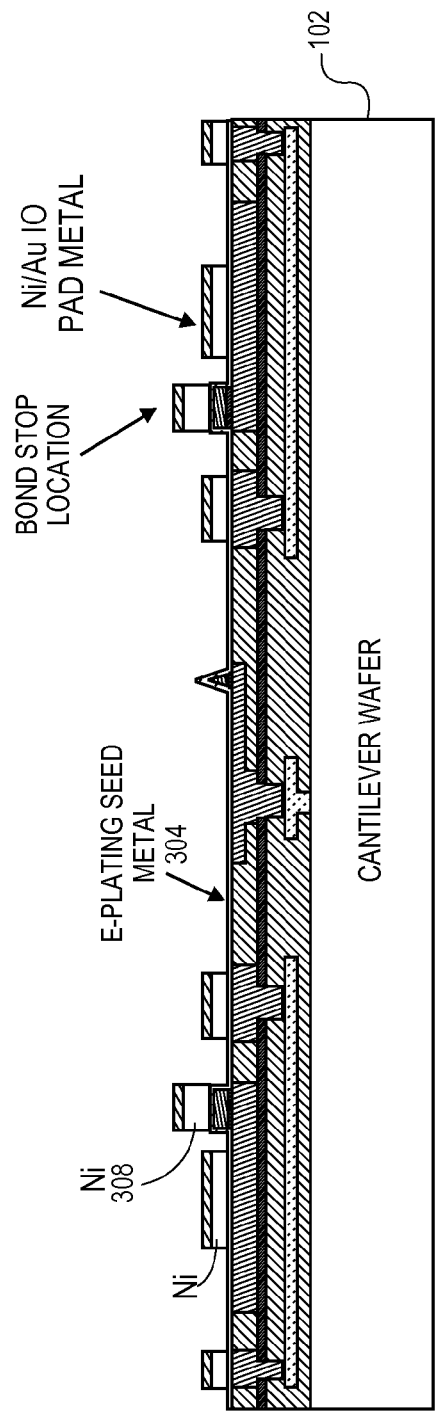
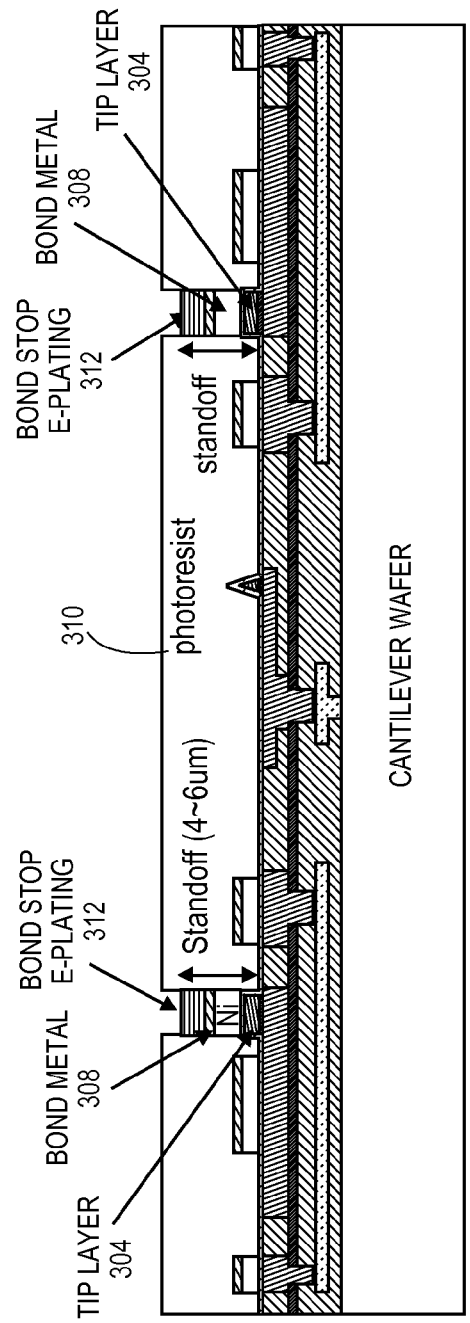
FIG. 3C
FIG. 3D

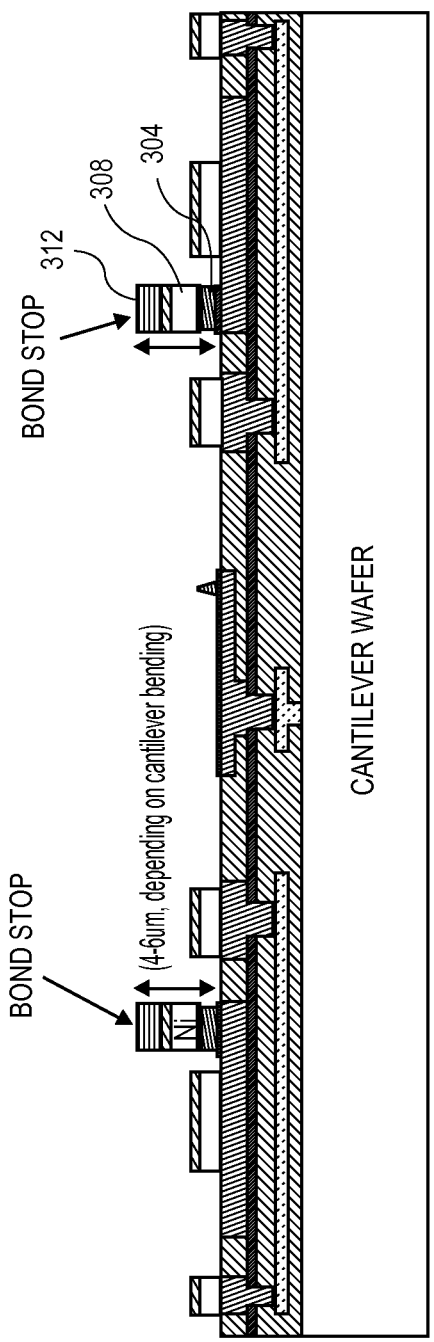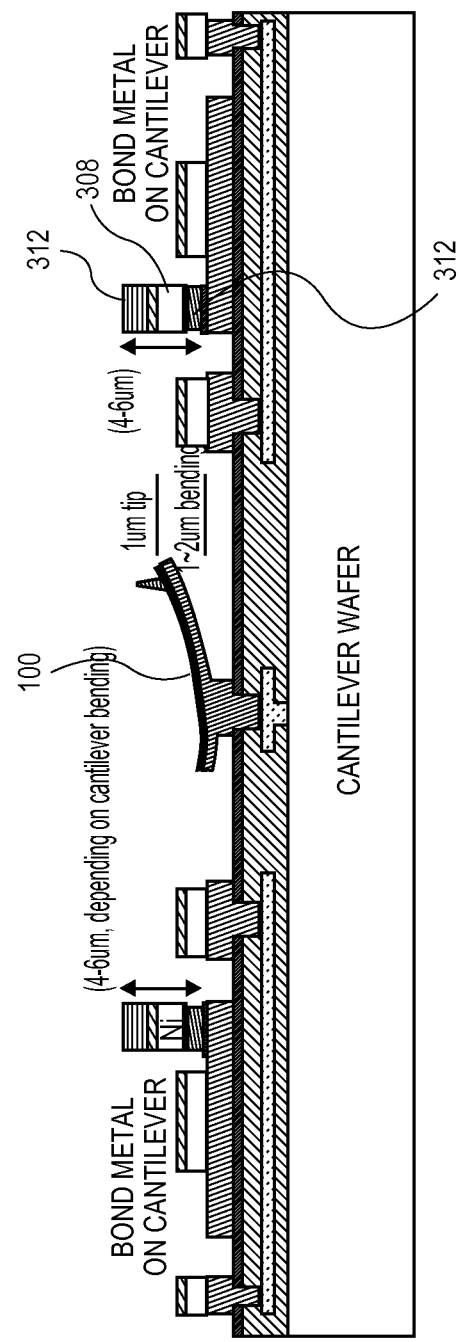

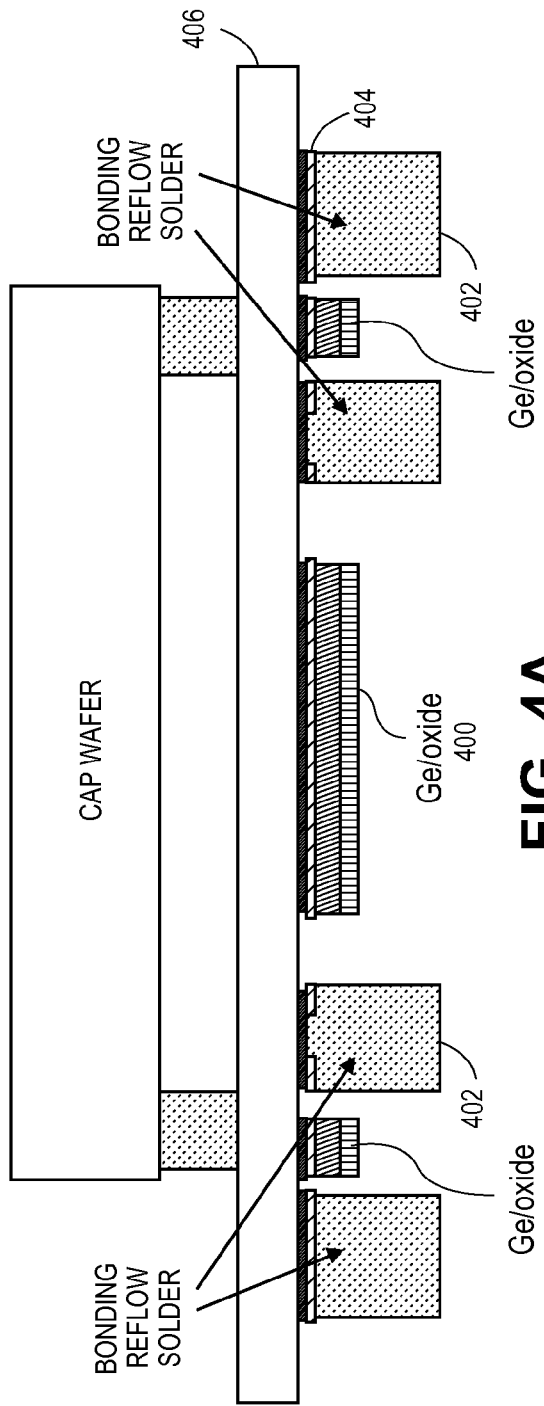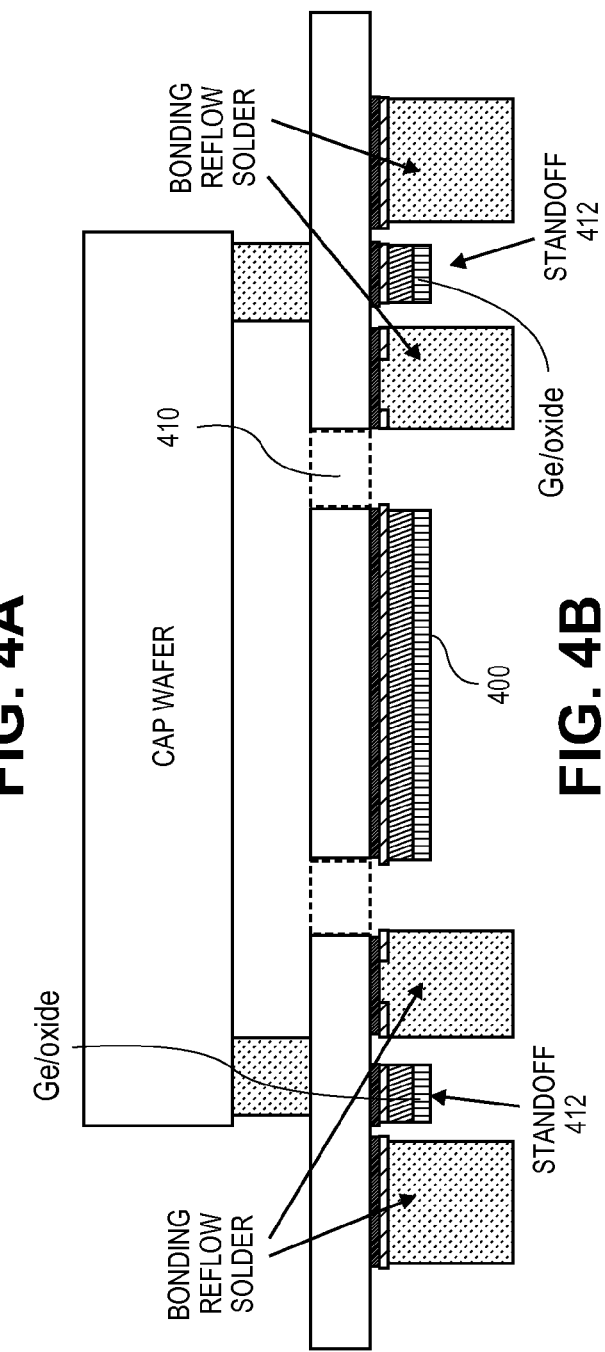

SEEK SCAN PROBE (SSP) CANTILEVER TO MOVER WAFER BOND STOP

FIELD OF THE INVENTION

Embodiments of the present invention are directed to micro-electromechanical system (MEMS) memory devices and, more particularly, to MEMS Seek-Scan Probe (SSP) memory devices.

BACKGROUND INFORMATION

Seek-scan probe (SSP) memories are a type of memory that uses non-volatile storage media as the data storage mechanism and offers significant advantages in both cost and performance over conventional charge-storage memories. Typical SSP memories include storage media made of materials that can be electrically switched between two or more states having different electrical characteristics such as resistance, polarization dipole direction, or some other characteristic.

SSP memories are written to by passing an electric current through the storage media or applying an electric field to the storage media. Passing a current through the storage media, or applying an electric field to the media, is typically accomplished by applying a voltage between a sharp probe tip on one side of the storage media and an electrode on the other side of the storage media. Current SSP memories use probe tips positioned on a free end of one or more MEMS probes. In an idle state each MEMS probe maintains the probe tip at a certain distance from the storage media, but before the electric field or current can be applied to the storage media the probe tip must usually be brought close to, or in some cases in direct contact with, the storage media.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

FIGS. 3A-3F show processing steps for forming the bond stop according to one embodiment;

FIG. 4A is a block diagram showing a mover process before the removal of a media protective layer;

FIG. 4B is a block diagram showing media protection layer removal with stand-off formation;

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
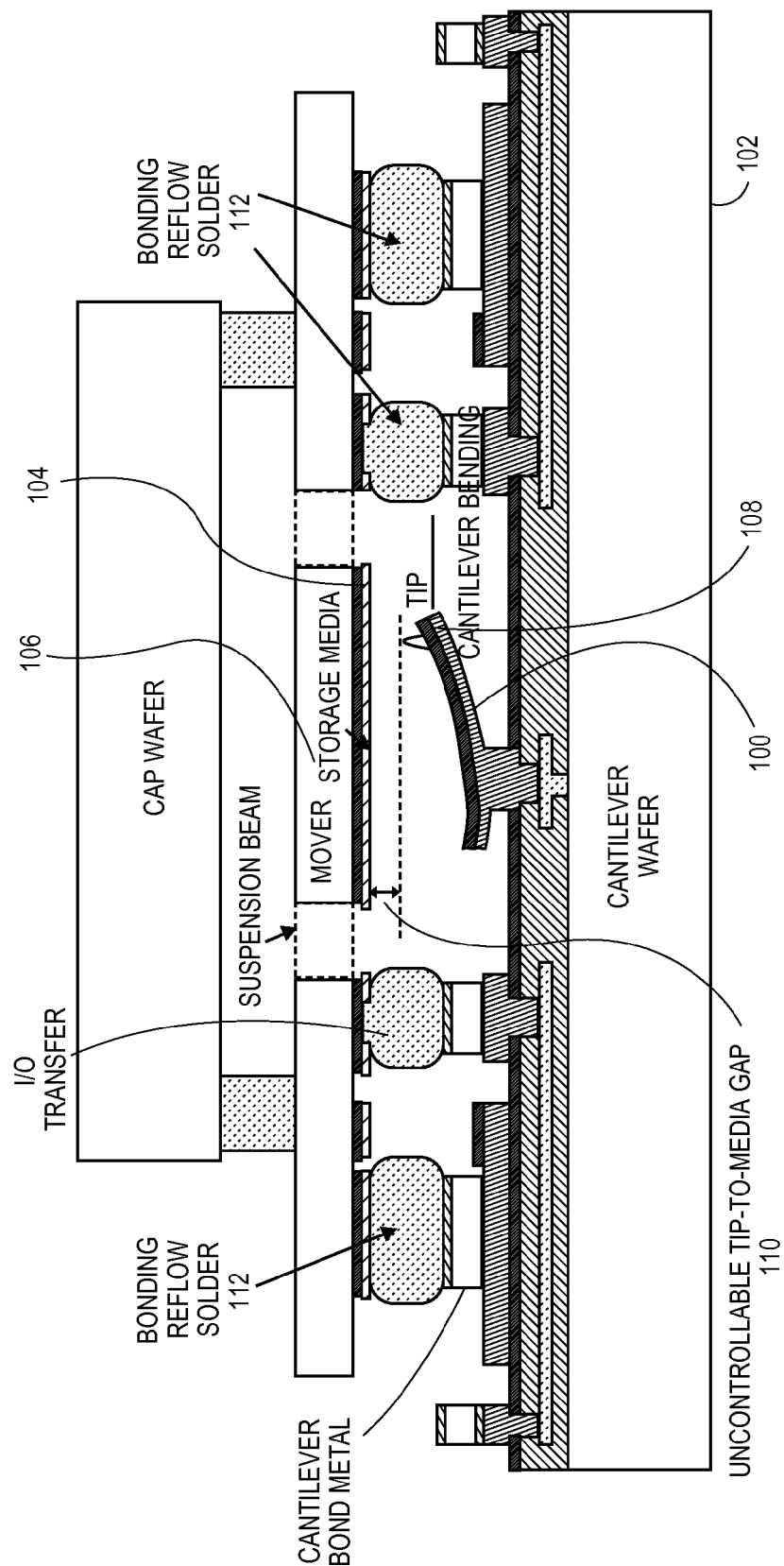
FIG. 1 is a block diagram of a SPP memory device having an uncontrolled tip to media gap.

FIG. 1 is a block diagram illustrating an SSP memory configuration in which a cantilever probe 100 is anchored to a substrate, also referred to as a cantilever wafer 102. The cantilever 100 may be actuated to contact or de-contact the storage media 104 on a mover 106 that carries the storage media 104 and is positioned over the cantilever wafer 102. Data tracks are stored in the storage media 104 and data is written and read as the media mover 106 scans relative to the cantilever tips 108.

A seek-scan probe (SSP) memory involves multiple-wafer bonding with small gaps in between. Solder reflow bonding is one of the most preferred wafer bonding approaches due to its reliability and ability to hermetically seal. As shown in FIG. 1, a precise gap 110 between the cantilever tip 108 to storage media surface 104 is important when the cantilever 100 is actuated to contact the media 104 with desired contact force. However, solder reflow 112 bonding process cannot provide a consistently controllable gap due to flowing solder during the bonding process by its nature. Thus, a bond stop technique and process is herein used to provide accurate cantilever to media gap control.

Figure 2:
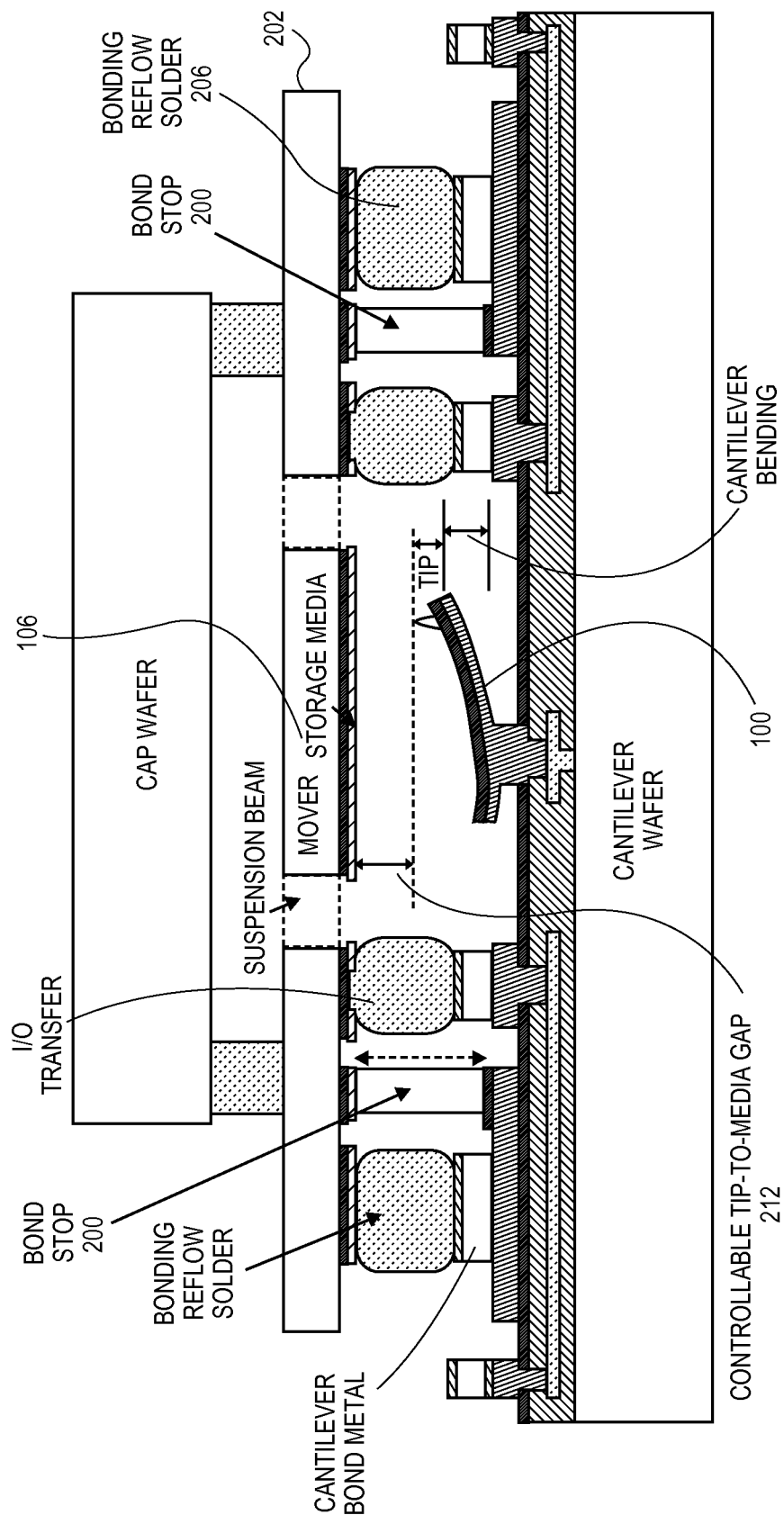
FIG. 2 is a block diagram of a SPP memory device having a bond stop to control the tip to media gap according to one embodiment.

FIG. 2 illustrates one embodiment of the present invention including a bond stop 200 for precise gap control between cantilever wafer 102 and mover wafer 202. Preferably, the bond stop 200 is rigid and acts as a spacer between cantilever wafer 102 and mover wafer 202. The bond stop 200 may be formed on either cantilever wafer 102 or mover wafer 202.

During a solder bonding process, the actual gap between cantilever wafer and mover wafer is defined by the thickness of bond stop 200 instead of reflowing solder 206. The bond stop 200 should be stiff to sustain bonding pressure. It also needs to tolerate the solder bonding temperature (~300 C) without deformation. Meanwhile, the formation of bond stop should be simple and provide high flexibility in changing to desired bond gap (i.e., flexibility on changing bond stop 200 thickness) without affecting other process steps. As a result, it is most advantageous when the full bond stop 200 thickness can be formed at the last step of the process on either cantilever wafer 102 or mover wafer 202. The full bond stop stack may have more than 6 um in thickness depending on the cantilever bending and desired tip-to-media gap 212. In one embodiment, an electroplated thick and hard metal may be used.

Referring now to FIGS. 3A-3F, these figures illustrate one way in

Figure 3A:
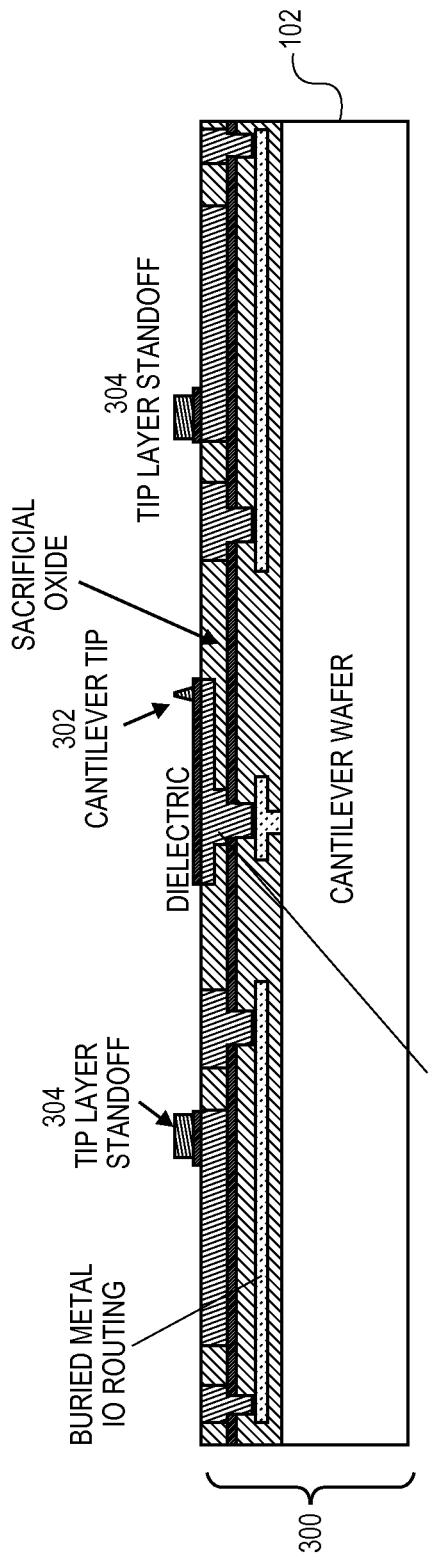

As shown in FIG. 3A, a standard cantilever process is first performed as known in the art 300, ready for standard bond metal electrode plating. When the tip layer (~1.5 um) for cantilever tip 302 is formed, this may also be used to form part of the bond stop layer stack standoff 304 as shown.

Figure 3B:
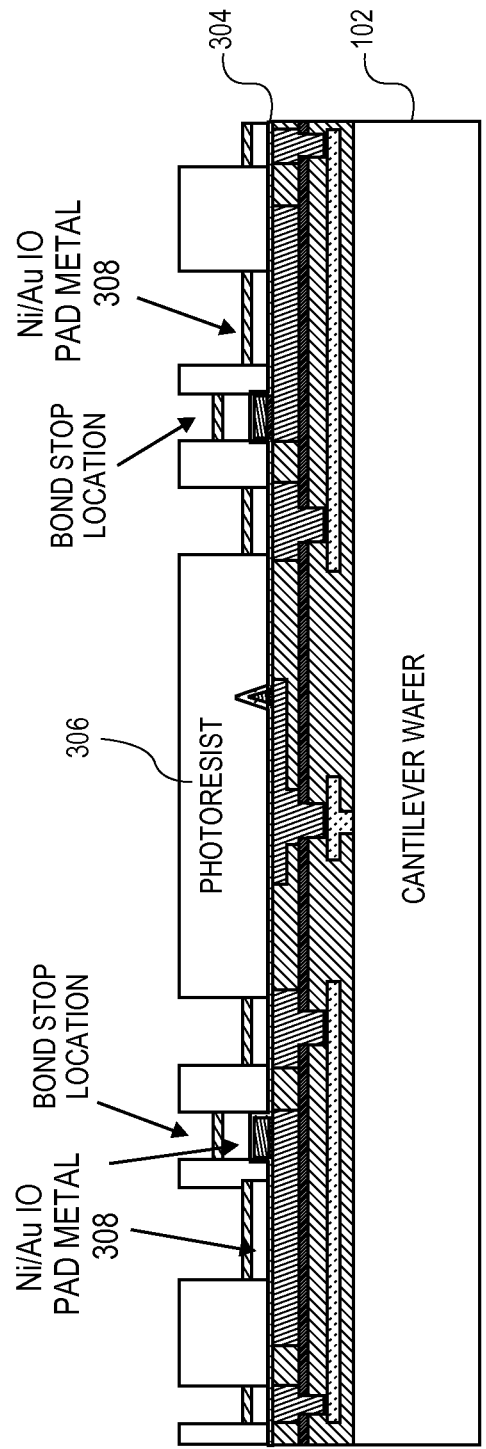

A seed metal (e.g., thin TiN/Cu) 304 is then deposited and photoresist 306 is defined for bond metal (e.g., Ni/Au) electroplating 308 as shown in FIG. 3B. The bond metal layer 308 (~1 um) is formed both at bond ring/IO pads and at the bond stop locations (on the tip layer standoff). The bond metal thickness becomes part of the bond stop stack in such case. The stack of tip layer and bond metal at bond stop location is usually too short (<3 um) to provide adequate bond stop height (e.g., ~6 um). However, with the addition of tip and bond metal layers at standoff location, the additional bond layer thickness required for final bond gap can be reduced (e.g., 3 um instead of 6 um).

As shown in FIG. 3C, after desired bond metal 312 is electroplated (e.g. 1 um), the photoresist mold 306 is then removed without etching the seed metal 304 as shown. In FIG. 3D, a final bond stop litho resist 310 is then patterned on previous seed metal 304 for additional hard metal electroplating for the bond stop 312 (e.g., Ni). The desired total standoff height of 4-6 um can be achieved (including stack of tip and bond metal layers) as illustrated in FIG. 3D.

As shown in FIG. 3E, the bond stop photoresist 310 is then removed and seed metal 304 is etched by resuming standard SSP cantilever process as shown in FIG. 3E. The cantilever 100 is finally released as shown in FIG. 3F. The cantilever 100 is usually bending upwards after release. The higher the cantilever bending, the higher the bond stop standoff may be required. The bond stop comprises the tip layer 304, bond metal layer 308, and final stop metal layer 312 to desired height of 4-6 um. Depending on the bending amount of cantilever and desired tip-to-media gap, higher bond stop layer can be easily increased by increasing the final stop metal thickness in electroplating.

FIG. 4A shows the standard mover process (simplified) before media protection layer 400 (Ge/oxide) is removed. A bonding solder metal 402 is formed on the media layer 404 to provide better bond ring adhesion and bonding seal instead of on the media protection layer 400, which may suffer delamination otherwise.

As shown in FIG. 4B, the media protection layer 400 may be locally removed on the mover area and then mover 406 is DRIE (Deep Reactive on Etch) released 410. In such a case, the Ge/oxide protection layer 400 may serve as additional standoff 412 on the mover side, which will reduce the required bond stop layer stack thickness on the cantilever wafer (not shown). However, an extra mask layer litho process may be need in this situation.

Figure 4C:
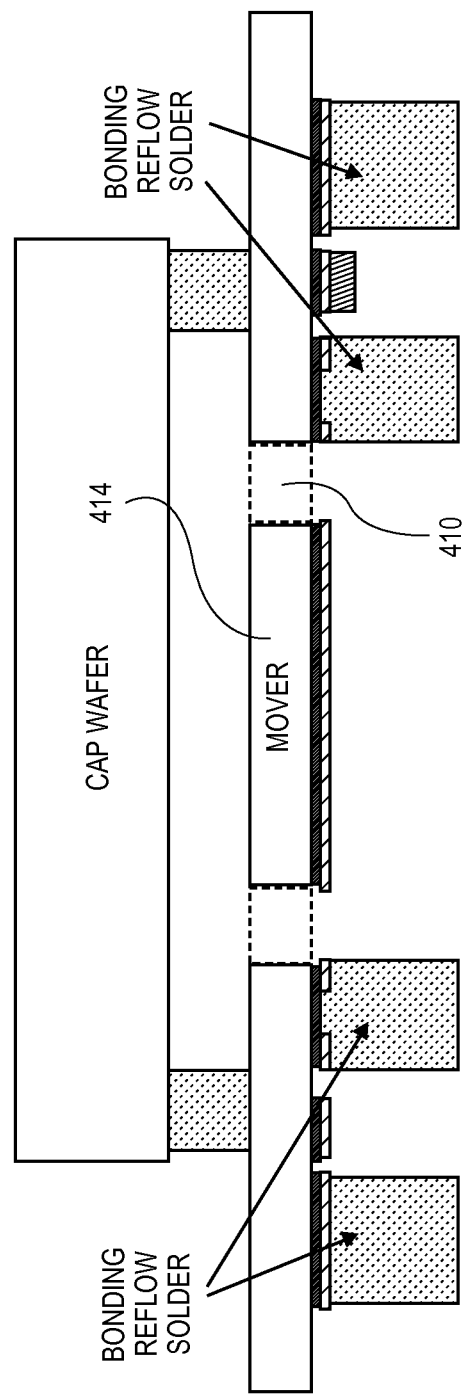
FIG. 4C is a block diagram showing media protection layer removal without a stand-off mask.

Referring to FIG. 4C, an alternative option is to masklessly remove Ge/oxide protection layer 400 (from FIG. 4A) and then DRIE release 410 the mover 414. This option simplifies the mover process without any limitation to Ge/Oxide media protection layer 400 thickness and process. The bond stop gap is then fully defined by the layer stack of standoff on the cantilever wafer as shown in FIG. 3D.

A corresponding cantilever bonding with precision gap stop control for the options shown in FIGS. 4B and 4C are shown in FIGS. 5A-B and FIGS. 6A-B, respectively.

Figure 5A:
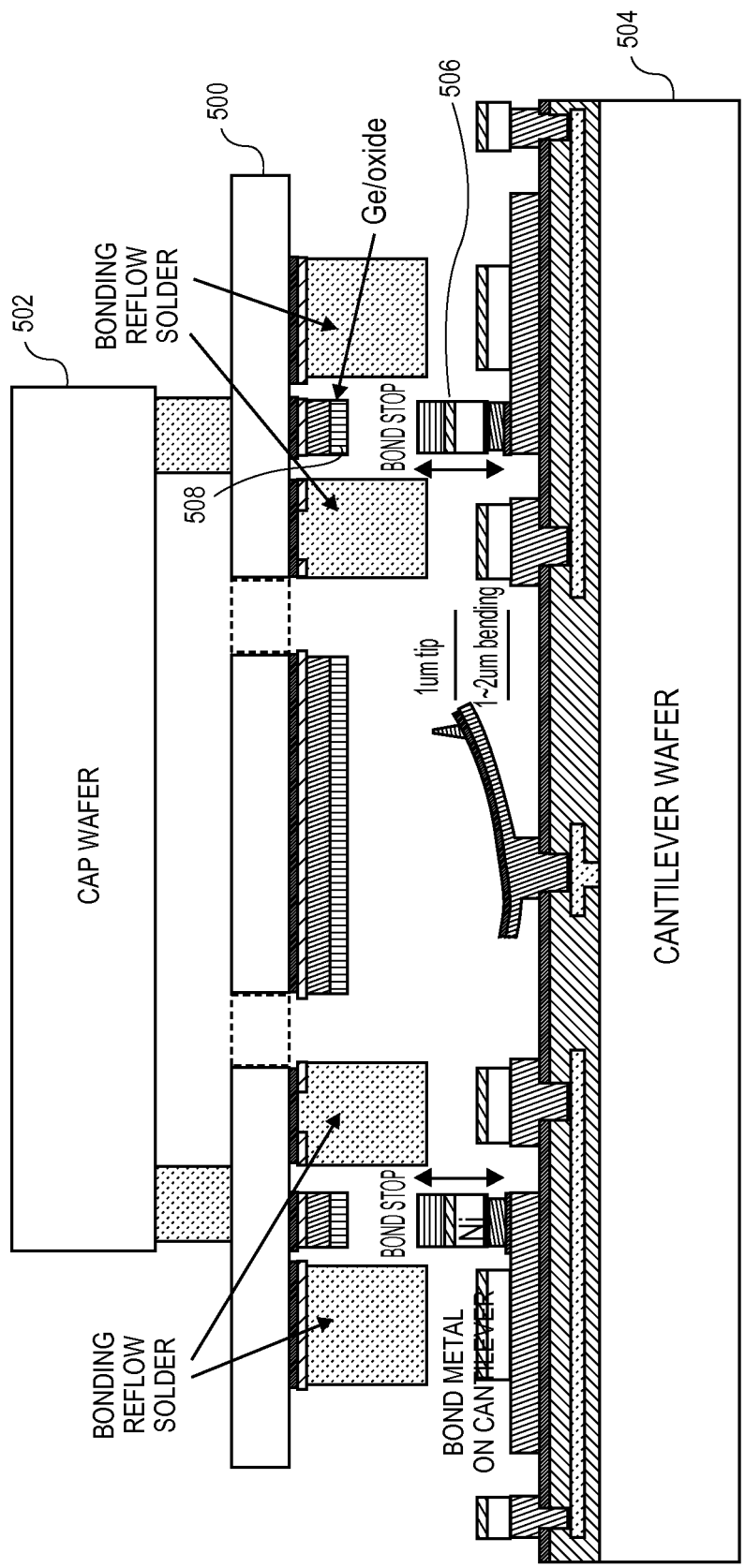
FIG. 5A is a block diagram showing the bond stop being formed part on the cantilever wafer and part on the mover wafer.
Figure 5B:
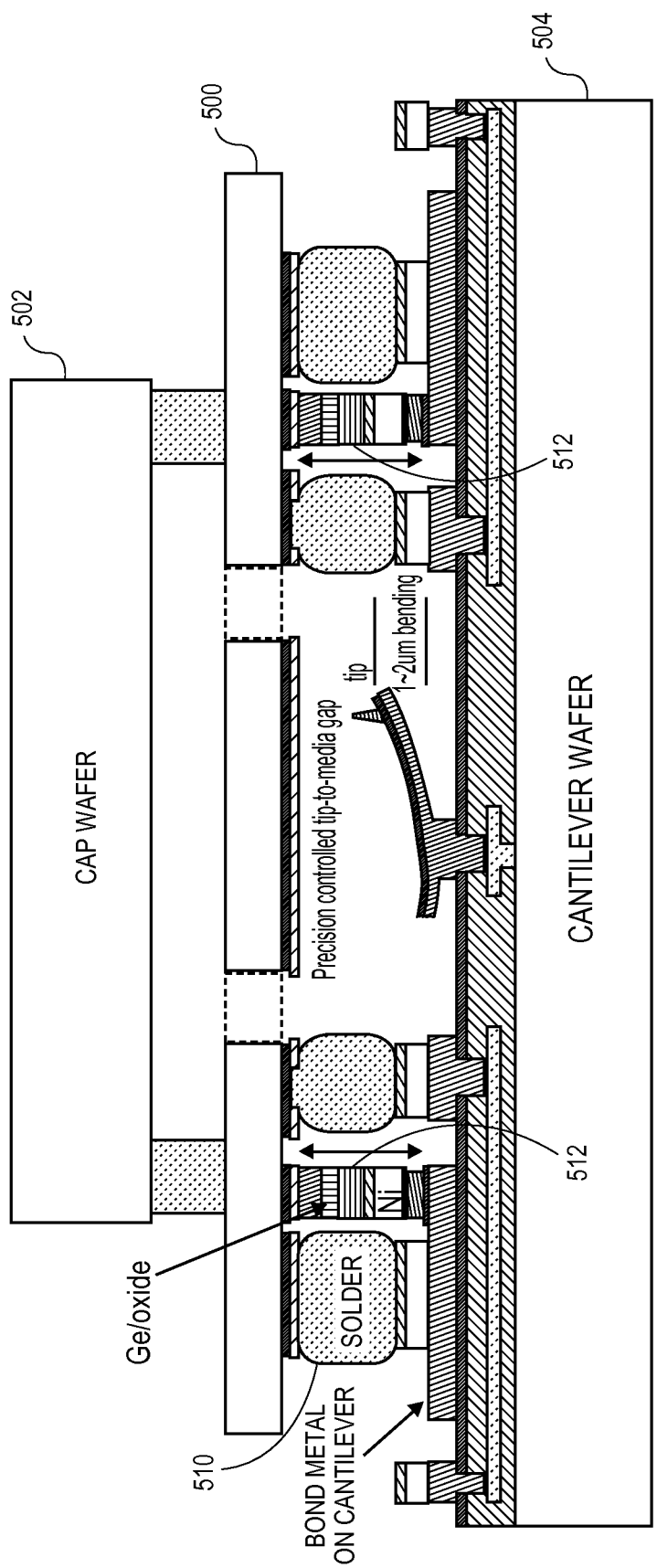
FIG. 5B is a block diagram showing the cantilever wafer and the mover wafer joined with the bond stop creating precision tip to media gap control.

As shown in FIG. 5A-5B, mover wafer 500 with cap 502 may be bonded to the cantilever wafer 504 with a first part of the bond stop stack 506 formed on the cantilever wafer 504 and a second part of the bond stop stack 508 formed on the mover wafer 500. When the two wafers are joined and the solder is reflowed 510, the combined lengths of the a first part of the bond stop stack 506 and the second part of the bond stop stack 508 combine to make the final bond stop stack 512.

Figure 6A:
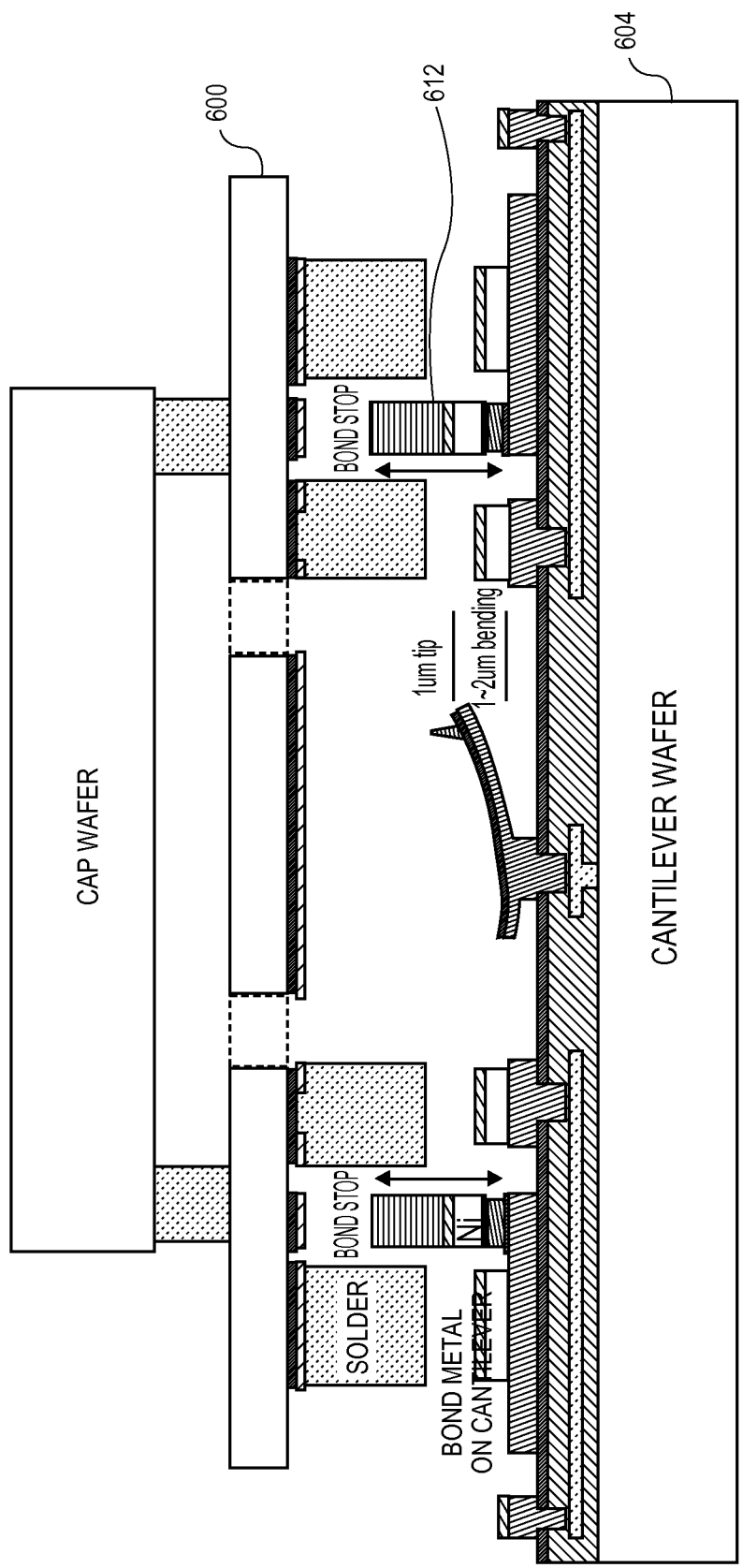
FIG. 6A is a block diagram showing the bond stop formed only on the cantilever wafer according to one embodiment.
Figure 6B:
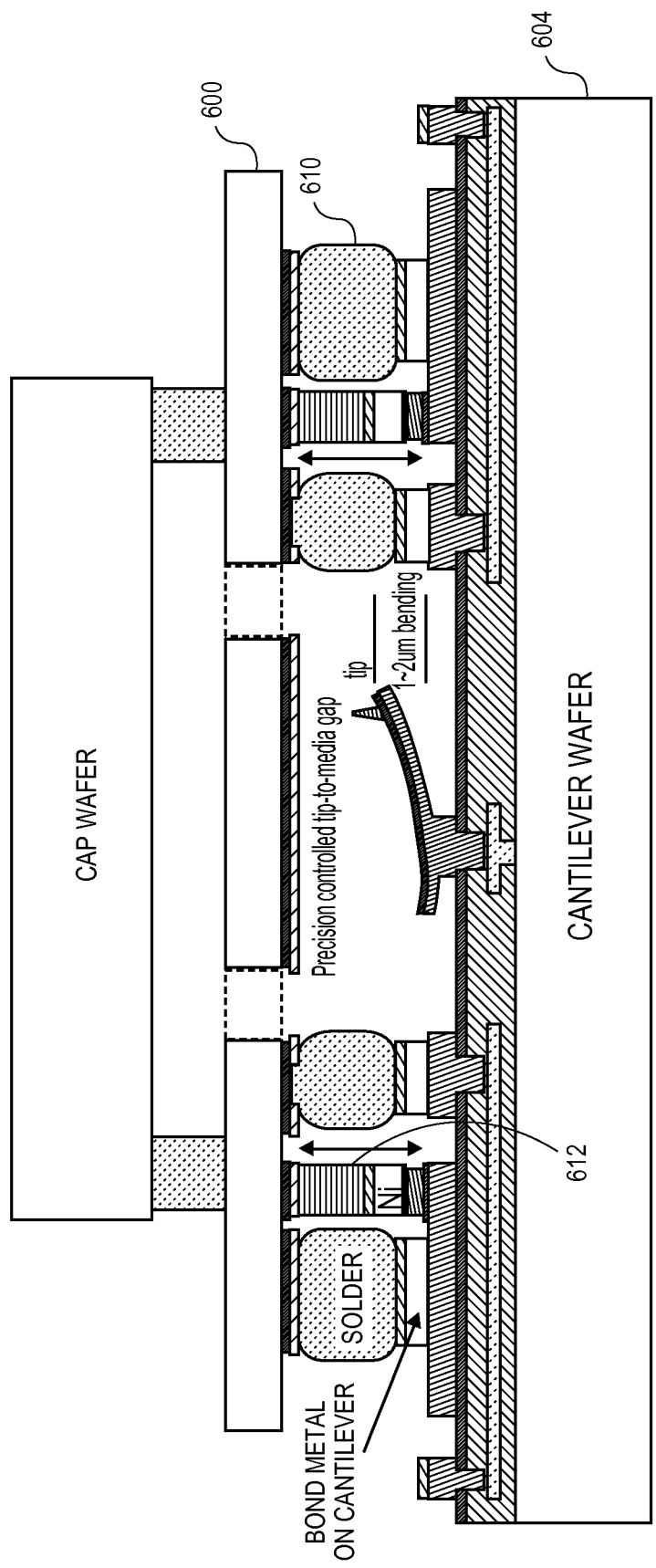
FIG. 6B is a block diagram as shown in FIG. 6A with the cantilever wafer and the mover wafer joined with the bond stop creating precision tip to media gap control.

FIGS. 6A-6B are similar except that the bond stop stack 612 is formed only on the cantilever wafer 604 and not on the mover wafer 600 such that when the solder is reflowed 610 the bond stop stack 612 creates the precision tip to media gap. Since the bond stop metal is formed in the last litho step on cantilever wafer 604, the final standoff stack thickness can be easily adjusted based on the desired gap, cantilever bending, and standoff height on the mover side. No prior processes or characterizations are affected for bond stop thickness (i.e., bond gap) adjustment.

Figure 7A:
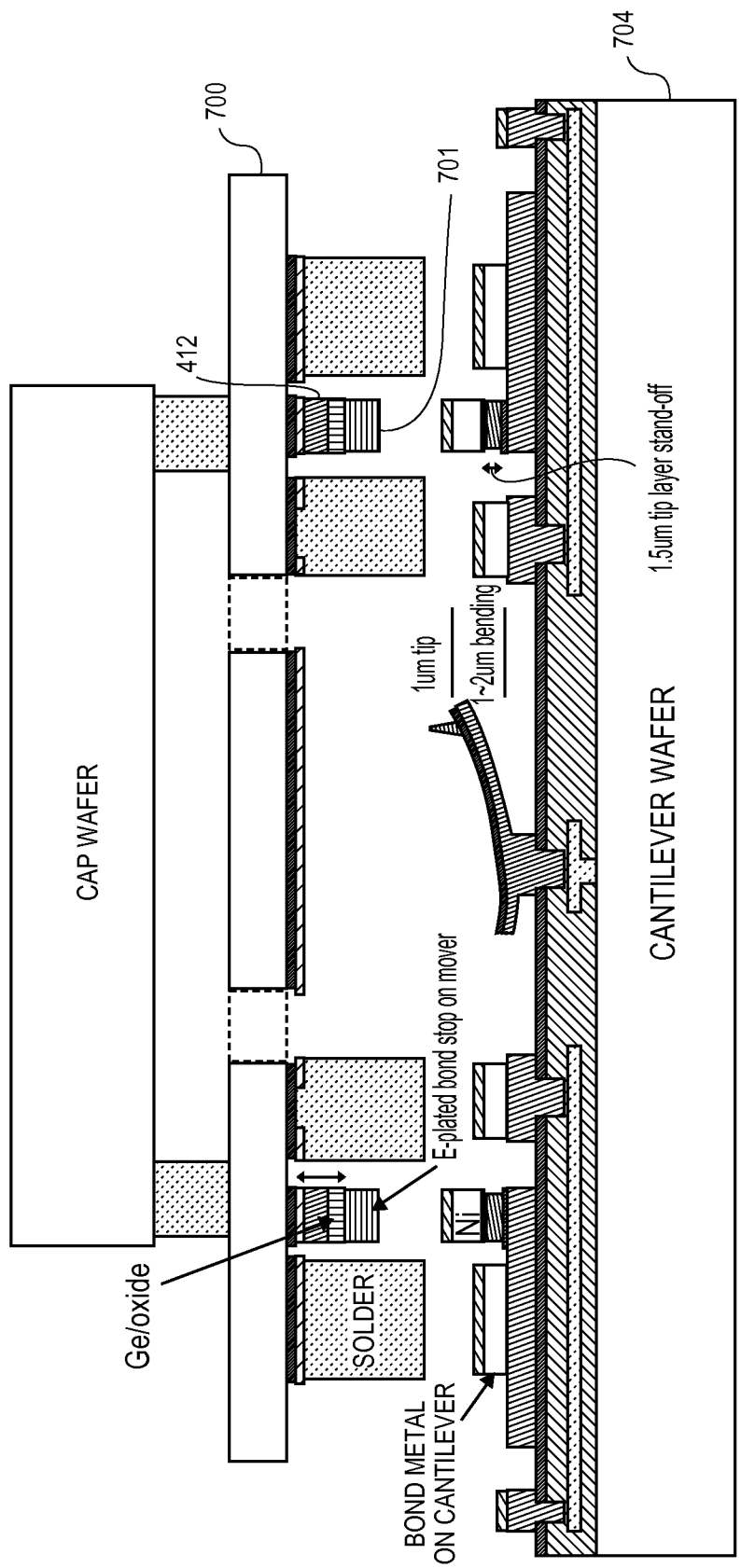
FIG. 7A is a block diagram showing an alternative bond stop formation on the mover wafer with a media protection layer.
Figure 7B:
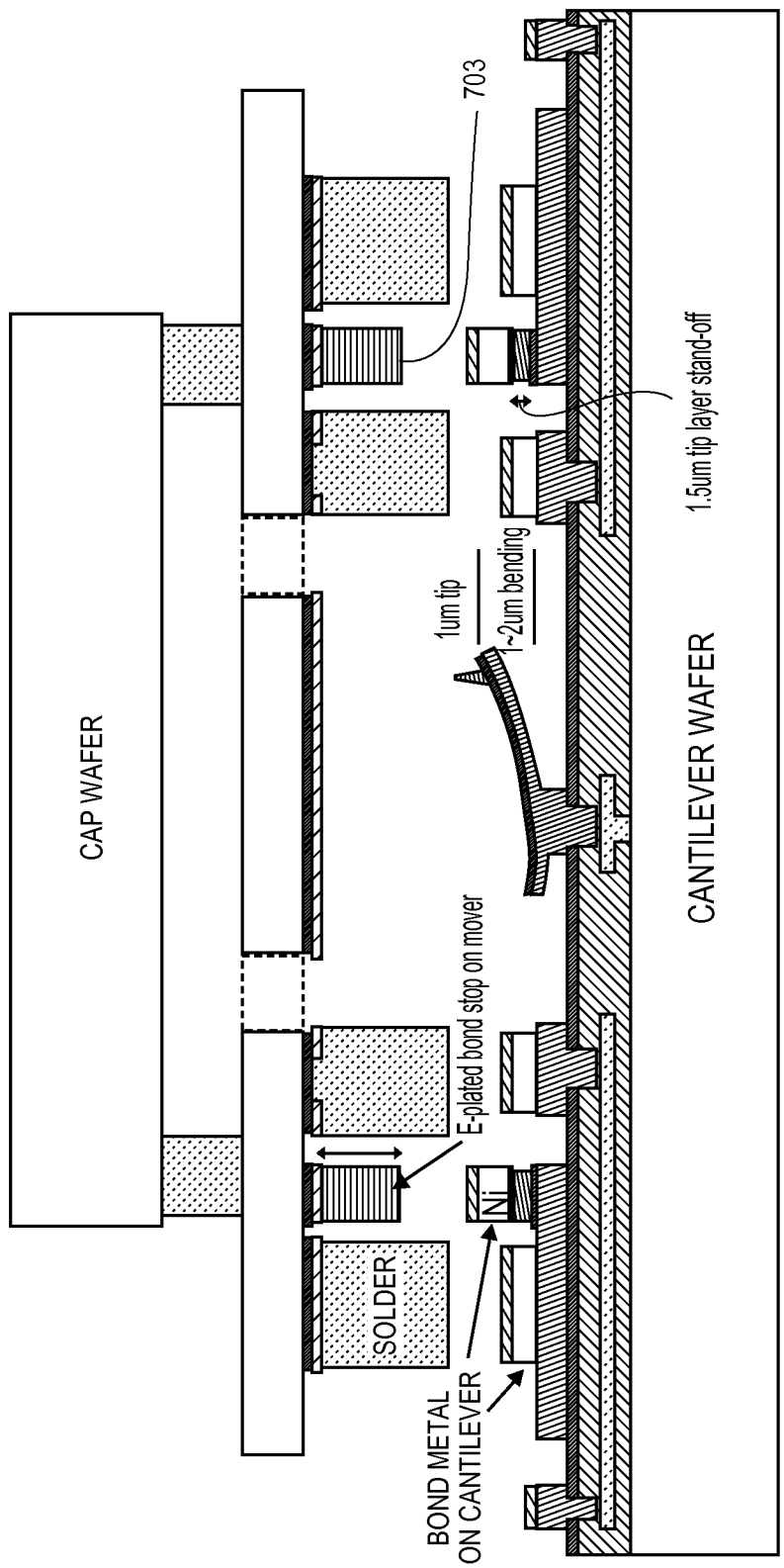
FIG. 7B is a block diagram showing an alternative bond stop on the mover wafer with no media protection layer.

FIGS. 7A and 7B illustrate alternatives with an electroplated bond stop metal standoff 701 formed on the mover wafer 700 instead of on cantilever wafer 704. The bond stop may include the media protection layer 412 (Ge/oxide) and the main electroplated stop 701 as shown in FIG. 7A or the only bond stop metal 703 when the media protection layer is not used as shown in FIG. 7B.

Figure 7C:
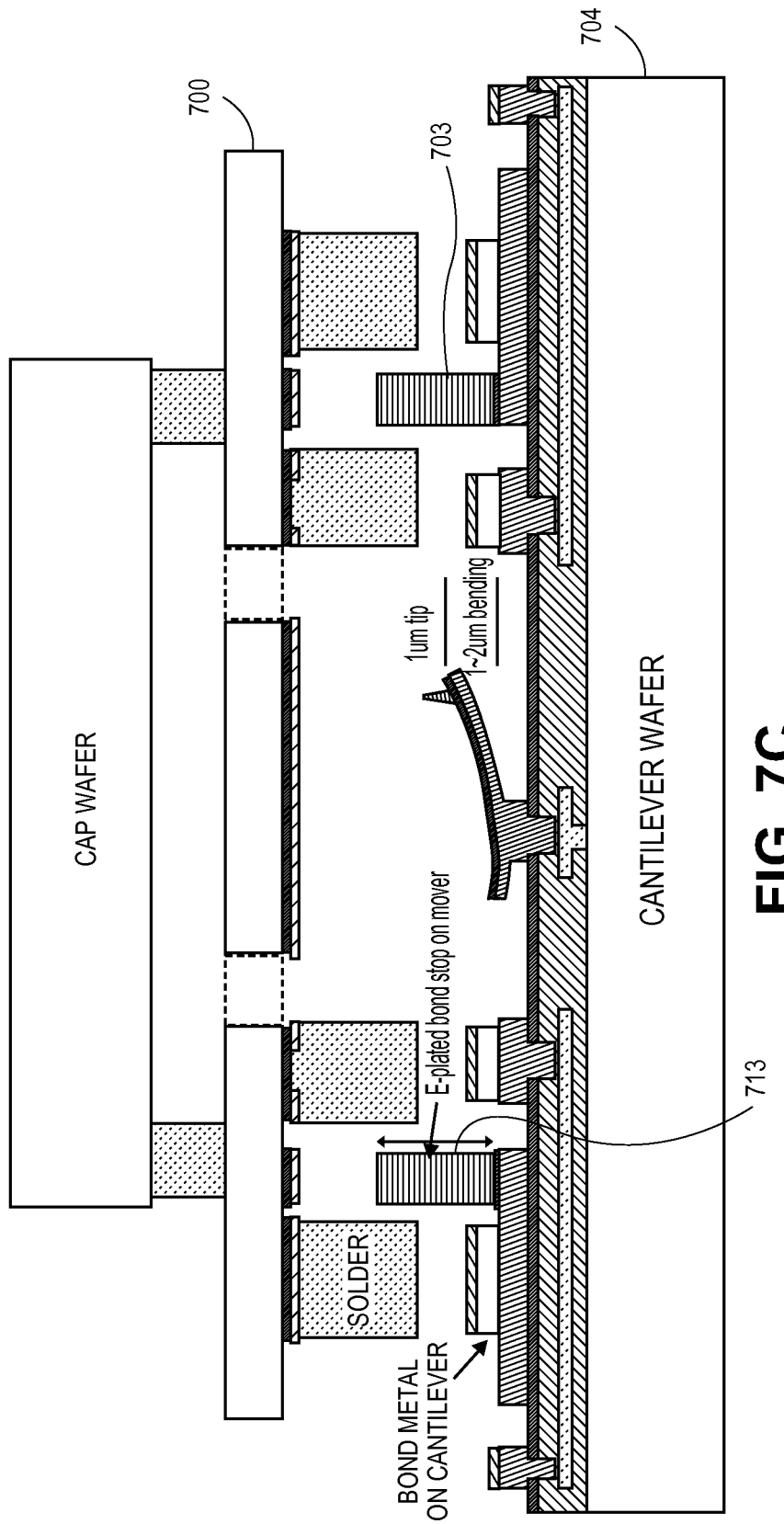
FIG. 7C is a block diagram of an alternative bond stop formation on the cantilever wafer with no other stand off stack.
Figure 7D:
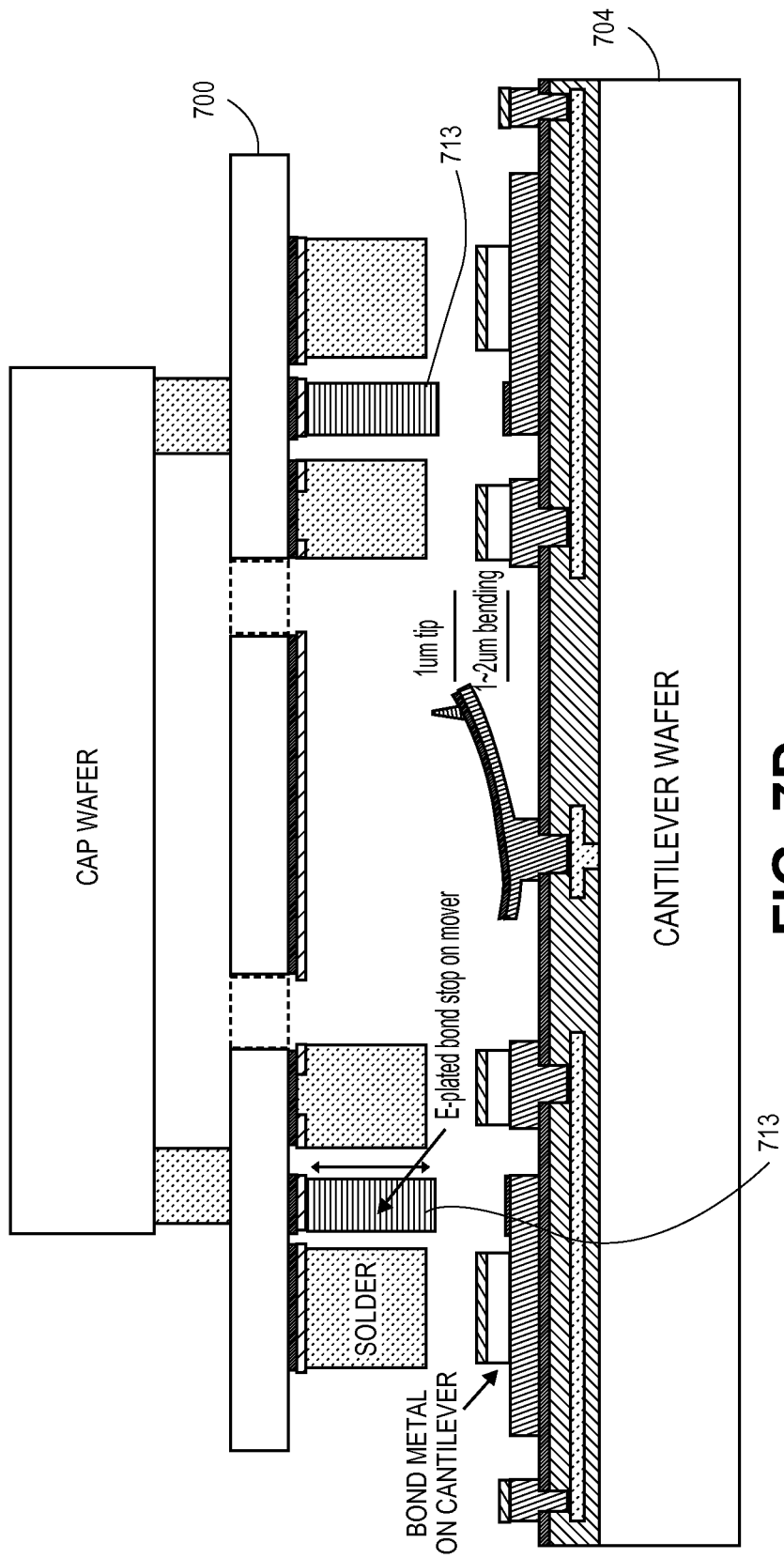
FIG. 7D is a block diagram of an alternative bond stop formation on the mover wafer with no other stand off stack.

Referring now to FIGS. 7C and 7D, for the case that the electroplating process allows a single layer of thick bond stop layer (e.g., 6 um Ni), the bond gap can be precisely controlled by the bond metal layer only without the addition of other layer stack for standoff. FIG. 7C shows the electroplated bond stop 713 formed only on the cantilever wafer 704. Similarly, FIG. 7C shows the electroplated bond stop 713 may be formed only on the mover wafer 700 before wafer bonding. Again, the since the bond stop is process as last litho step, it provides high flexibility on the bond gap control without affect any prior process steps on either the cantilever or mover wafers.

Advantageously, the inventive bonding stop process allows for precision gap control between cantilever to mover surface in SSP as well as provides high flexibility on the gap control without affecting the rest of the mover and cantilever process.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a first wafer;
   a second wafer to be spaced a precise distance from the first wafer bonded with a solder seal, wherein the first wafer comprises a cantilever wafer and the second wafer comprises a mover wafer for a seek scan probe (SSP) memory device; and
   a rigid bond stop between the first wafer and the second wafer to control the distance between the first wafer and the second wafer when the solder is reflowed.

2. The apparatus as recited in claim 1 wherein the bond stop is formed on the mover wafer.

3. The apparatus as recited in claim 1 wherein the bond stop is formed on the cantilever wafer.

4. The apparatus as recited in claim 1 wherein the bond stop is form in part on the mover wafer and in part on the cantilever wafer.

5. The apparatus as recited in claim 1 wherein bond stop length includes a media protective layer.

6. The apparatus as recited in claim 5 wherein the media protective layer includes germanium/oxide.

7. A method for forming a bond stop on a seek-scan probe (SSP) memory device, comprising:
 providing a cantilever wafer having an SSP cantilever;
 forming a tip layer stand-off when forming a cantilever tip;
 electroplating a seed metal layer over the cantilever wafer;
 defining a bond stop location over the tip layer stand-off with a photoresist mask;
 depositing a bond metal over the tip layer stand-off; and
 electroplating a metal to a desired thickness over the bond metal to form the desired length of the bond stop.

8. The method as recited in claim 7, wherein the seed metal layer comprises TiN/Cu.

9. The method as recited in claim 8 wherein the bond metal comprises Ni/Au.

10. The method as recited in claim 9 wherein the electroplated metal comprises Ni.

11. The method as recited in claim 7 where part of the bond stop length comprises a media protective layer.

12. The method as recited in claim 7 wherein a stand-off is formed on the mover wafer.

13. A seek-scan probe (SSP) memory system, comprising:
 a mover wafer including a released mover able to move relative to the mover wafer;
 a memory media layer on the mover;
 a cantilever wafer comprising a plurality of cantilever probes having tips to read and write to the memory media layer spaced from the memory media according to a tip to media gap;
 a solder seal to join the mover wafer to the cantilever wafer; and
 a rigid bond stop between the mover wafer and the cantilever wafer to control the tip to media gap when the solder is reflowed.

14. A seek-scan probe (SSP) memory system as recited in claim 13 wherein the bond stop is formed on the mover wafer.

15. The seek-scan probe (SSP) memory system as recited in claim 13 wherein the bond stop is formed on the cantilever wafer.

16. The seek-scan probe (SSP) memory system as recited in claim 13 wherein the bond stop is form in part on the mover wafer and in part on the cantilever wafer.

17. The seek-scan probe (SSP) memory system as recited in claim 13 wherein the bond stop comprises:
 a stack comprising a plurality of layers formed when fabricating the cantilever wafer; and
 an electroplated metal on the stack to determine a final bond stop length.

18. The seek-scan probe (SSP) memory system as recited in claim 13 wherein the bond stop comprises:
 a stack of comprising a plurality of layers formed when fabricating the mover wafer; and
 an electroplated metal combined with the stack to determine a final bond stop length.

* * * * *